(12) United States Patent
Wang

(10) Patent No.: US 7,968,954 B2
(45) Date of Patent: *Jun. 28, 2011

(54) INTERMEDIATE SEMICONDUCTOR DEVICE HAVING NITROGEN CONCENTRATION PROFILE

(75) Inventor: Zhongze Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 229 days.

This patent is subject to a terminal disclaimer.

(21) Appl. No.: 11/756,922

(22) Filed: Jun. 1, 2007

(65) Prior Publication Data

US 2007/0222002 A1 Sep. 27, 2007

Related U.S. Application Data

(60) Continuation of application No. 10/985,573, filed on Nov. 10, 2004, now Pat. No. 7,259,435, which is a division of application No. 10/651,314, filed on Aug. 28, 2003, now Pat. No. 7,314,812.

(51) Int. Cl.
*H01L 29/78* (2006.01)

(52) U.S. Cl. ........... 257/412; 257/413; 257/E21.247; 257/E21.409; 438/585; 438/592

(58) Field of Classification Search .......... 257/410–413, 257/E21.247, E21.409; 438/585, 592
See application file for complete search history.

(56) References Cited

U.S. PATENT DOCUMENTS

| | | | |
|---|---|---|---|
| 5,516,707 A | 5/1996 | Loh et al. | |
| 5,554,871 A | 9/1996 | Yamashita et al. | |
| 5,633,200 A * | 5/1997 | Hu | 438/653 |
| 5,885,877 A | 3/1999 | Gardner et al. | |
| 5,908,312 A | 6/1999 | Cheung et al. | |
| 5,977,600 A | 11/1999 | Wristers et al. | |
| 5,998,828 A | 12/1999 | Ueno et al. | |
| 6,017,808 A * | 1/2000 | Wang et al. | 438/528 |
| 6,180,473 B1 * | 1/2001 | Hong et al. | 438/303 |
| 6,184,110 B1 | 2/2001 | Ono et al. | |
| 6,242,348 B1 * | 6/2001 | Kamal et al. | 438/682 |
| 6,287,906 B1 | 9/2001 | Yamashita et al. | |
| 6,300,664 B1 * | 10/2001 | Kuroi et al. | 257/410 |
| 6,391,751 B1 | 5/2002 | Wu et al. | |
| 6,413,881 B1 | 7/2002 | Aronowitz et al. | |
| 6,458,663 B1 | 10/2002 | Moore et al. | |

(Continued)

OTHER PUBLICATIONS

Kuroi et al., Novel NICE (Nitrogen Implantation into CMOS Gate Electrode and Source-Drain) Structure for high Reliability and High Performance 0.25 μm Dual Gate CMOS, IEEE 1993.

*Primary Examiner* — Khiem D Nguyen
(74) *Attorney, Agent, or Firm* — TraskBritt

(57) ABSTRACT

A method for reducing the effective thickness of a gate oxide using nitrogen implantation and anneal subsequent to dopant implantation and activation is provided. More particularly, the present invention provides a method for fabricating semiconductor devices, for example, transistors, which include a hardened gate oxide and which may be characterized by a relatively large nitrogen concentration at the polysilicon/gate oxide interface and a relatively small nitrogen concentration within the gate oxide and at the gate oxide/substrate interface. Additionally, the present invention provides a method for fabricating a semiconductor device having a metal gate strap (e.g., a metal silicide layer) disposed over the polysilicon layer thereof, which device includes a hardened gate oxide and which may be characterized by a relatively large nitrogen concentration at the silicide/polysilicon interface to substantially prevent cross-diffusion.

8 Claims, 2 Drawing Sheets

U.S. PATENT DOCUMENTS

| | | |
|---|---|---|
| 6,521,527 B1 | 2/2003 | Kuroi et al. |
| 6,528,396 B2 | 3/2003 | Moore |
| 6,544,908 B1 | 4/2003 | Weimer et al. |
| 6,680,246 B2 | 1/2004 | Hu |
| 6,709,960 B1 | 3/2004 | Xiang et al. |
| 6,744,102 B2 | 6/2004 | Trivedi |
| 6,756,646 B2 | 6/2004 | Buchanan et al. |
| 6,767,794 B2 | 7/2004 | Gardner et al. |
| 6,838,363 B2 * | 1/2005 | Wieczorek et al. ........... 438/528 |
| 6,949,479 B2 | 9/2005 | Wang |
| 6,953,747 B2 | 10/2005 | Cho |
| 7,112,485 B2 | 9/2006 | Vaartstra |
| 7,259,435 B2 * | 8/2007 | Wang ........................... 257/410 |
| 2006/0194452 A1 | 8/2006 | Beaman et al. |

* cited by examiner

INTERMEDIATE SEMICONDUCTOR DEVICE HAVING NITROGEN CONCENTRATION PROFILE

CROSS-REFERENCE TO RELATED APPLICATIONS

This application is a continuation of application Ser. No. 10/985,573, filed Nov. 10, 2004, now U.S. Pat. No. 7,259,435, issued Aug. 21, 2007, which is a divisional of application Ser. No. 10/651,314, filed Aug. 28, 2003, now U.S. Pat. No. 7,314,812, issued Jan. 1, 2008. The disclosure of each of the previously referenced U.S. patents is hereby incorporated by reference in its entirety.

FIELD OF THE INVENTION

The present invention relates generally to semiconductor devices and methods for their fabrication. More particularly, the present invention relates to hardening of gate oxides in semiconductor devices by nitrogen implantation and anneal subsequent to dopant implantation and activation to increase the dielectric constant thereof and, accordingly, decrease the effective thickness of the gate oxide.

BACKGROUND

Higher performance, enhanced reliability and greater packaging density are constant goals of the semiconductor industry. However, as components of integrated circuits become increasingly smaller to meet these goals, it has become more and more difficult to produce semiconductor devices capable of reliable, long-term operation, particularly in view of the operational stresses each component of a state of the art semiconductor device must endure. For instance, as surface P-channel transistors decrease in size, the size and thickness of the gate oxides included in such transistors must also decrease. However, as gate oxide thickness continues to be compressed, the gate oxides become increasingly permeable to dopants included in the overlying polysilicon gate electrodes. Further, they become less resistant to hot electron degradation and more susceptible to breakdown voltages below normal operating voltages.

To address these problems, various processes for hardening gate oxides and, accordingly, reducing the effective thickness thereof, have become highly beneficial to the fabrication of state of the art semiconductor devices. For instance, a method well known in the art for forming hardened gate oxides involves implanting nitrogen into a semiconductor substrate (e.g., a silicon substrate) followed by thermal oxide growth on the top surface of the substrate. During the thermal oxide growths oxynitride is formed at the gate oxide/substrate interface. As oxynitride has a higher dielectric constant than pure oxide, the resultant oxide effective thickness is smaller than it would be without the nitrogen implantation.

Another conventional method for forming hardened gate oxides involves implanting nitrogen into the gate oxide after formation thereof. The method includes providing a semiconductor substrate, forming a gate oxide layer over the semiconductor substrate and subjecting the gate oxide layer to a nitrogen implantation treatment. The nitrogen penetrates the top surface of the gate oxide layer but does not initially bind therewith. As such, the nitrogen implantation is followed by an oxidative anneal which results in the formation of oxynitride in the gate oxide layer and at the gate oxide/substrate interface. Again, due to the increased dielectric constant of the oxynitride relative to pure oxide, the resultant gate oxide layer has a smaller effective thickness than it would have without the nitrogen implantation.

In addition to having an increased dielectric constant, relative to nonhardened devices, gate oxides hardened by known methods are generally less permeable to dopants included in polysilicon electrodes, more resistant to hot electron degradation and less susceptible to breakdown voltages below normal operating voltages. However, known processes for hardening gate oxides also have drawbacks. For example, in order to prevent diffusion of dopants from the polysilicon electrode into and through the gate oxide, known hardening processes often provide a high concentration of nitrogen at the interface of the gate oxide and the underlying semiconductor substrate. However, as is known to those of ordinary skill in the art, excessive nitrogen at the gate oxide/substrate interface significantly degrades transistor performance.

Accordingly, in terms of device performance and reliability, it has been found to be advantageous to fabricate a gate oxide layer having a relatively small nitrogen concentration at the gate oxide/substrate interface with the bulk of the nitrogen concentration being located at the polysilicon/gate oxide interface. The relatively large nitrogen concentration at the polysilicon/gate oxide interface effectively prevents diffusion of dopants from the polysilicon electrode and into and through the gate oxide layer while the relatively small nitrogen concentration at the gate oxide/substrate interface confers resistance to hot electron degradation without substantially affecting device performance. Further, in addition to the nitrogen concentration at the gate oxide/substrate interface, it has been found to be advantageous for a relatively small concentration of nitrogen to be located within the gate oxide to aid in increasing the dielectric constant of the gate oxide and, accordingly, in reducing the effective thickness thereof. While some known processing techniques (e.g., rapid plasma nitridation (RPN) and decoupled plasma nitridation (DPN)) provide transistors including a gate oxide having a relatively large nitrogen concentration at the polysilicon/gate oxide interface and a relatively small nitrogen concentration within the gate oxide and at the gate oxide/substrate interface, such techniques are often prohibitively expensive.

At least one method has been developed in an attempt to provide a transistor including a gate oxide having some of the above-stated characteristics. U.S. Pat. No. 6,017,808 to Wang et al. (hereinafter "the '808 patent") describes a method for hardening a gate oxide designed to provide a transistor wherein a large peak of nitrogen exists within the polysilicon and gate oxide layers at the polysilicon/gate oxide interface, while a relatively smaller nitrogen peak occurs within the gate oxide layer and the underlying semiconductor substrate at the gate oxide/substrate interface. To achieve this structure, the method of the '808 patent requires implanting nitrogen through a first polysilicon layer and into the gate oxide layer followed by an anneal step. After the implantation and annealing steps, a first, relatively large, nitrogen peak occurs entirely within the first polysilicon layer, a second, relatively smaller, nitrogen peak occurs at the polysilicon/gate oxide interface, and a third, relatively smaller still, nitrogen peak occurs at the gate oxide/substrate interface. However, due to its magnitude, the first nitrogen peak located entirely within the first polysilicon layer is somewhat counterproductive because it retards activation of subsequently implanted dopants, such as boron, within the first polysilicon layer. Therefore, the method of the '808 patent requires removal of the portion of the first polysilicon layer which includes the first nitrogen peak without removing the portion of the first polysilicon layer which includes the second nitrogen peak (i.e., the peak occurring at the polysilicon/gate oxide interface) to form a second polysilicon layer. Once the portion of the first polysilicon layer including the first nitrogen peak is removed to form the second polysilicon layer, a third, nitrogen-free polysilicon layer may be optionally formed over the second, nitrogen-implanted, polysilicon layer.

As will be readily appreciated, achieving the structure disclosed in the '808 patent using the methods described therein is at best difficult, particularly in light of the continually decreasing thickness of polysilicon electrodes included in state of the art semiconductor devices. One of the most troublesome aspects of the method described in the '808 patent is the need to remove only the portion of the nitrogen-implanted polysilicon layer including the first nitrogen peak. The reference teaches that this task may be accomplished using known wet etch, dry etch, or chemical mechanical processing techniques. However, the polysilicon layers used for polysilicon electrodes in state of the art transistors are exceedingly thin. The polysilicon electrodes of some state of the art devices may be as tin as seven or fewer molecular monolayers, and known etching and polishing processes are difficult to control with sufficient precision to remove only predetermined portions of material layers of such minute thicknesses. Moreover, in this context, the polysilicon layer will include varying concentrations of nitrogen at any given depth, and as the nitrogen concentration varies, the etch rate will also vary, making precise control of the etching process even more difficult. Thus, removing only the portion of the first polysilicon layer, including the first nitrogen peak, is extremely difficult, and known removal processes will most likely result in removal of too much or too little polysilicon material, resulting in transistors exhibiting impaired performance or reduced reliability.

A further problem, that of cross-diffusion, is encountered when a metal gate strap (e.g., a metal silicide layer) is disposed over the polysilicon layer. Cross-diffusion occurs, for example, in surface P-channel transistors having both P-type and N-type dopants that may diffuse across the silicide/polysilicon interface and contaminate underlying layers. A relatively large concentration of nitrogen at the silicide/polysilicon interface may substantially prevent dopant diffusion across the interface. However, known processing techniques do not provide semiconductor devices having a relatively large concentration of nitrogen at the silicide/polysilicon interface. In particular, a transistor fabricated utilizing the methods described in the '808 patent would not alleviate cross-diffusion as the portion of the first polysilicon layer including the first nitrogen peak is removed therefrom. If, in later processing, a silicide layer were to be formed over the second polysilicon layer, there would be insufficient nitrogen at the silicide/polysilicon interface to effectively substantially prevent cross-diffusion across the interface. As an alternative embodiment, the '808 patent describes a method wherein a third, nitrogen-free polysilicon layer may be formed over the second polysilicon layer. If, in later processing, a metal gate strap were to be formed over the third polysilicon layer, there would be a substantial absence of nitrogen at the silicide/polysilicon interface and cross-diffusion would probably occur.

It would, therefore, be desirable to provide a method for fabricating semiconductor devices, for instance, transistors, which include a hardened gate oxide and which may be characterized by a relatively large nitrogen concentration at the polysilicon/gate oxide interface and a relatively small nitrogen concentration within the gate oxide and at the gate oxide/substrate interface which may be easily incorporated into current fabrication processes and is not prohibitively expensive. Further, it would be desirable to provide a method for fabricating semiconductor devices (e.g., transistors) that include a metal gate strap disposed over the polysilicon layer thereof and which include a hardened gate oxide, the devices characterized by a relatively large nitrogen concentration at the silicide/polysilicon interface to substantially prevent cross-diffusion.

BRIEF SUMMARY OF THE INVENTION

The present invention, in one embodiment, includes a method for fabricating a semiconductor device, for example, a transistor, which includes a hardened gate oxide and which may be characterized by a relatively large nitrogen concentration at the polysilicon/gate oxide interface and a relatively small nitrogen concentration within the gate oxide and at the gate oxide/substrate interface. The method includes providing a semiconductor substrate having a gate oxide layer formed thereover, depositing a polysilicon layer atop the gate oxide layer, implanting dopants into the polysilicon layer, activating the implanted dopants and subjecting the resultant structure to a nitrogen implantation treatment sufficient such that nitrogen penetrates the polysilicon layer, the gate oxide layer and at least a portion of the semiconductor substrate. The dosage of nitrogen and the energy at which it is implanted may be adjusted such that the bulk of the implanted nitrogen is concentrated in the polysilicon layer while a relatively small concentration of nitrogen penetrates below the polysilicon/gate oxide interface. In later processing, an anneal may be performed which alters the nitrogen concentration profile such that a relatively large nitrogen concentration is exhibited in the polysilicon and oxide layers at the polysilicon/gate oxide interface and a relatively small nitrogen concentration is exhibited within the gate oxide and at the gate oxide/substrate interface.

In a semiconductor device having a gate oxide hardened utilizing the method of the present invention, the nitrogen at the polysilicon/gate oxide interface acts as a diffusion barrier to prevent diffusion of dopants from the polysilicon layer into and through the gate oxide layer. Additionally, nitrogen concentrated at the gate oxide/substrate interface also aids in preventing dopant diffusion; however, his concentration is not so great as to substantially impair device performance. Further, the nitrogen within the gate oxide layer reacts with the pure oxide to form oxynitride, which has an increased dielectric constant. Accordingly, the effective thickness of the gate oxide layer is reduced.

In another embodiment, the present invention includes a method for fabricating a semiconductor device, e.g., a transistor, which includes a metal silicide layer disposed over the polysilicon layer thereof and a hardened gate oxide, the device characterized by a relatively large nitrogen concentration at the silicide/polysilicon interface, a relatively smaller nitrogen concentration at the polysilicon/gate oxide interface and a relatively smaller still nitrogen concentration within the gate oxide and at the gate oxide/substrate interface. The method includes providing a semiconductor substrate having a gate oxide layer formed thereover, depositing a polysilicon layer atop the gate oxide layer, implanting dopants into the polysilicon layer, activating the implanted dopants, depositing a metal silicide layer over the polysilicon layer and subjecting the resultant structure to a nitrogen implantation treatment sufficient such that nitrogen penetrates the metal silicide layer, the polysilicon layer, the gate oxide layer and at least a portion of the semiconductor substrate. The dosage of nitrogen and the energy at which it is implanted may be adjusted such that the bulk of the implanted nitrogen is concentrated at the silicide/polysilicon interface white a relatively small concentration of nitrogen penetrates below the polysilicon/gate oxide interface. In later processing, an anneal may be performed which alters the nitrogen concentration profile such that a relatively large nitrogen concentration remains at the silicide/polysilicon interface, a relatively smaller concentration of nitrogen is exhibited at the polysilicon/gate oxide interface and a relatively smaller still concentration of nitrogen is exhibited within the gate oxide layer and at the gate oxide/substrate interface.

In a semiconductor device having a metal gate strap and a gate oxide hardened utilizing the method of the present invention, the nitrogen concentrated at the silicide/polysilicon interface acts to substantially prevent cross-diffusion of dopants across the interface and the concentration of nitrogen at the polysilicon/gate oxide interface acts as a diffusion barrier to prevent diffusion of dopants from the polysilicon layer into and through the gate oxide layer. Nitrogen concentrated at the gate oxide/substrate interface also aids in preventing dopant diffusion; however, this concentration is not so great as to substantially impair device performance. Further, the nitrogen within the gate oxide layer reacts with the pure oxide to form oxynitride and, accordingly, increases the dielectric constant of the gate oxide layer and reduces the effective thickness thereof.

Other features and advantages of the present invention will become apparent to those of ordinary skill in the art to which the present invention pertains through consideration of the ensuing descriptions the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

The present invention is directed to a method for reducing the effective thickness of a gate oxide using nitrogen implantation and anneal subsequent to dopant implantation and activation. More particularly, the invention is directed to a method for fabricating semiconductor devices, for example, transistors, which include a hardened gate oxide and which may be characterized by a relatively large nitrogen concentration at the polysilicon/gate oxide interface and a relatively small nitrogen concentration within the gate oxide and at the gate oxide/substrate interface. Additionally, the invention is directed to a method for fabricating a semiconductor device, e.g., a transistor, having a metal gate strap (e.g., a metal silicide layer) disposed over the polysilicon layer thereof, which device includes a hardened gate oxide and which may be characterized by a relatively large nitrogen concentration at the silicide/polysilicon interface to substantially prevent cross-diffusion. The particular embodiments described herein are intended in all respects to be illustrative rather than restrictive. Other and further embodiments will become apparent to those of ordinary skill in the art to which the present invention pertains without departing from its scope.

Figure 1:
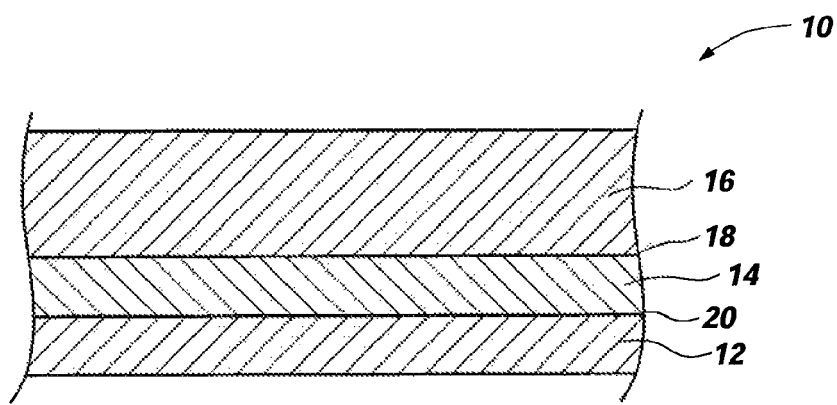
FIG. 1 is a side cross-sectional view schematically illustrating an intermediate structure in the fabrication of a semiconductor device having a hardened gate oxide formed in accordance with the method of the present invention.

With initial reference to FIG. 1, a cross-sectional view of an intermediate structure 10 in the formation of a semiconductor device, e.g., a transistor, fabricated according to the method of the present invention is illustrated. It should be understood and appreciated that the methods and structures described herein do not form a complete process for manufacturing transistors or other semiconductor devices. The remainder of the process is known to those of ordinary skill in the art and, therefore, only the process steps and structures necessary to understand the present invention are described herein. Additionally, it should be understood that while the depicted method illustrates formation of a gate stack for use in a transistor, the method may also be applied to any structure wherein a reduced oxide electrical thickness is desired including, without limitation, capacitors. It should be further understood that the figures presented in conjunction with this description are not meant to be actual cross-sectional views of any particular portion of an actual transistor or other semiconductor device, but are merely idealized representations which are employed to more clearly and fully depict the method of the invention than would otherwise be possible. Elements common between the figures maintain the same numeric designation.

The method of the present invention includes providing a semiconductor substrate 12 having a gate oxide layer 14 formed thereover. The semiconductor substrate 12 may be formed of any suitable material known to those of ordinary skill in the art, and the gate oxide layer 14 may be formed over the semiconductor substrate 12 using any known process and any suitable material known in the art. For example, the semiconductor substrate 12 may be fabricated using silicon and the gate oxide layer 14 may include silicon dioxide ($SiO_2$) which has been thermally grown or vapor deposited using well-known methods. The gate oxide layer 14 may be formed in various thicknesses to suit various fabrication processes. By way of example and not limitation, the gate oxide layer 14 may have a thickness of about 50 angstroms or less. For use in state of the art 0.18 micron technology, a gate oxide layer 14 having a thickness in the range of about 30 angstroms to about 40 angstroms is currently preferred.

A polysilicon layer 16 is formed over the gate oxide layer 14 using conventional deposition processes. The polysilicon layer 16 may also be formed in various thicknesses to suit various fabrication processes. However, it is currently preferred that the polysilicon layer 16 have a thickness of about 400 angstroms to about 1000 angstroms, more preferably about 600 angstroms. Dopants, such as boron, are subsequently implanted into the polysilicon layer 16 followed by an anneal, as is known to those of ordinary skill in the art.

After dopant implantation and anneal, nitrogen is implanted into the intermediate structure 10 at a dosage and energy sufficient to penetrate the polysilicon layer 16, the gate oxide layer 14 and at least a portion of the semiconductor substrate 12. The dosage and energy should be sufficient such that the bulk of the nitrogen concentration is located entirely within the polysilicon layer 16 while a relatively small concentration of nitrogen penetrates below the polysilicon/gate oxide interface 18. By way of example and not limitation, greater than about 90% by weight of the total amount of nitrogen implanted may be located entirely within the polysilicon layer 16 while less than about 10% by weight of the total amount of nitrogen implanted may penetrate below the polysilicon/gate oxide interface 18.

Figure 2A:
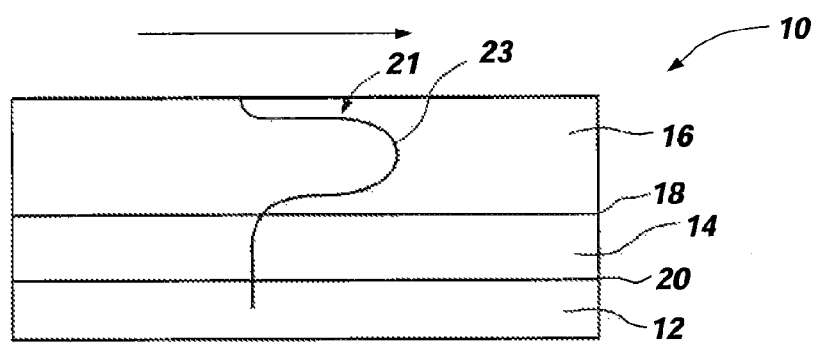
FIG. 2A illustrates areas of nitrogen concentration in the intermediate structure of FIG. 1 after nitrogen implantation.

Typically, the nitrogen implantation takes place at room temperature at a dosage ranging from between about $1\times10^{15}$ atoms/cm$^2$ to about $1\times10^{16}$ atoms/cm$^2$, and at an energy ranging from between about 10 keV to about 40 keV. A desired nitrogen concentration profile of the intermediate structure 10 after nitrogen implantation is illustrated in FIG. 2A, wherein areas of nitrogen concentration are indicated by line 21 and nitrogen concentration is increased in the direction of the arrow. The concentrations and the size of peak 23 depend on the thickness of the polysilicon layer 16, the gate oxide layer 14 and the semiconductor substrate 12, as well as the implantation dosage and energy. Accordingly, FIG. 2A should be used for a qualitative, rather than a quantitative, understanding. Typically, not more than about $1\times10^{14}$ atoms/cm$^2$ to about $1\times10^{15}$ atoms/cm$^2$ penetrates below the polysilicon/gate oxide interface 18.

Figure 2B:
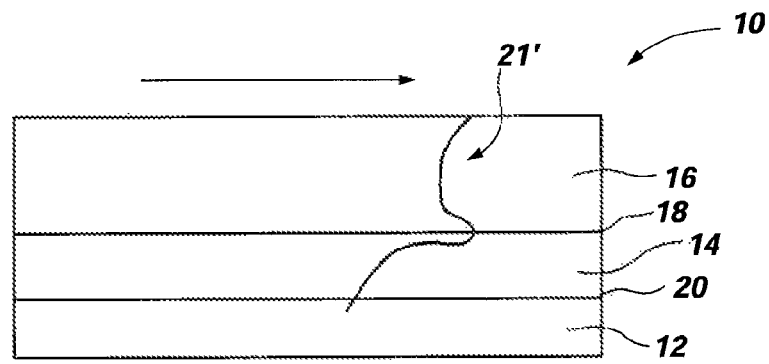
FIG. 2B illustrates areas of nitrogen concentration in the intermediate structure of FIG. 1 subsequent to anneal.

In later processing, an anneal may be performed at between about 850° C. and 1050° C. in an ambient nitrogen environment for between about 10 seconds and 30 minutes to alter the nitrogen concentration profile of the intermediate structure 10. A desired nitrogen concentration profile of the intermediate structure 10 after anneal is illustrated in FIG. 2B, wherein areas of nitrogen concentration are indicated by line 21' and nitrogen is increased in the direction of the arrow. As is evident from FIG. 2B, the nitrogen concentration profile of the intermediate structure 10 subsequent to anneal includes a relatively large nitrogen concentration in the polysilicon layer 16 and gate oxide layer 14 at the polysilicon/gate oxide interface 18 and a relatively small nitrogen concentration within the gate oxide layer 14 and at the gate oxide/substrate interface 20. As with FIG. 2A, FIG. 2B should be used for a qualitative, rather than a quantitative, understanding.

In the intermediate structure 10 shown in FIG. 2B, the nitrogen at the polysilicon/gate oxide interface 18 acts as a diffusion barrier to prevent diffusion of dopants from the polysilicon layer 16 into and through the gate oxide layer 14. Nitrogen concentrated at the gate oxide/substrate interface 20 also aids in preventing dopant diffusion. However, the concentration of nitrogen at the gate oxide/substrate interface 20 is not so great as to substantially impair device performance. Further, the nitrogen within the gate oxide layer 14 reacts with the pure oxide to form oxynitride, which has an increased dielectric constant. Accordingly, the effective thickness of the gate oxide layer 14 is reduced. Utilizing the method of the present invention, an increase of about 5.0% to about 10.0% in the dielectric constant of the gate oxide layer 14 may be achieved. Equivalently, a reduction of about 5.0% to about 10.0% in the effective thickness of the gate oxide layer 14 may be achieved. Thus, an exemplary gate oxide layer 14 having a thickness of about 30 angstroms may instead have a thickness of about 28.5 angstroms if hardened using the method of the present invention.

Figure 3:
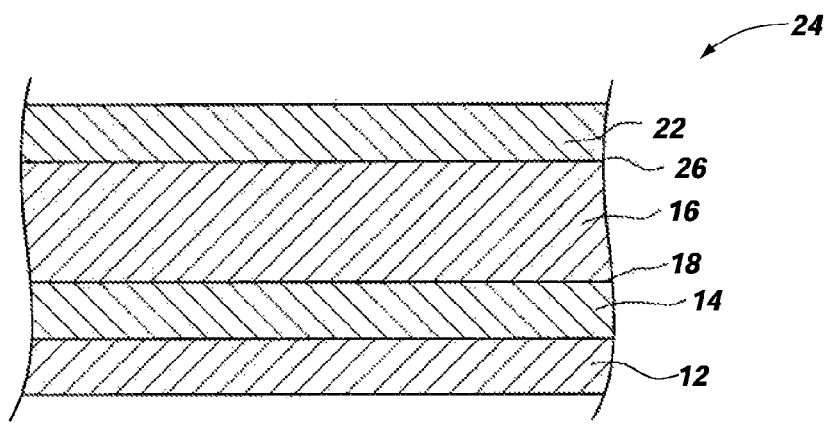
FIG. 3 is a side cross-sectional view schematically illustrating a second intermediate structure in the fabrication of a semiconductor device having a metal gate strap and a hardened gate oxide formed in accordance with the method of the present invention.

As known to those of ordinary skill in the art, a metal gate strap 22 (e.g., a metal silicide layer) is often disposed over the polysilicon layer 16 to lower the resistance of the resultant semiconductor device (see, FIG. 3). However, semiconductor devices, for instance, surface P-channel transistors, having both P-type and N-type dopants may encounter cross-diffusion when a metal silicide layer 22 is used. As more fully described below, using the method of the present invention, cross-diffusion may be substantially prevented.

Referring now to FIG. 3, a cross-sectional view of a second intermediate structure 24 in the formation of a semiconductor device having a metal silicide layer 22 formed over the polysilicon layer 16 thereof is illustrated. The metal silicide layer 22 may be formed of any suitable material known to those of ordinary skill in the a including, but not limited to, tungsten silicide, and may be formed over the polysilicon layer 16 using known processes. The metal silicide layer 22 may be formed over the polysilicon layer 16 subsequent to dopant implantation and anneal and may be formed in various thicknesses to suit various fabrication processes. However, it is currently preferred that the metal silicide layer 22 have a thickness of about 200 angstroms to about 1000 angstroms, more preferably about 600 angstroms.

Figure 4A:
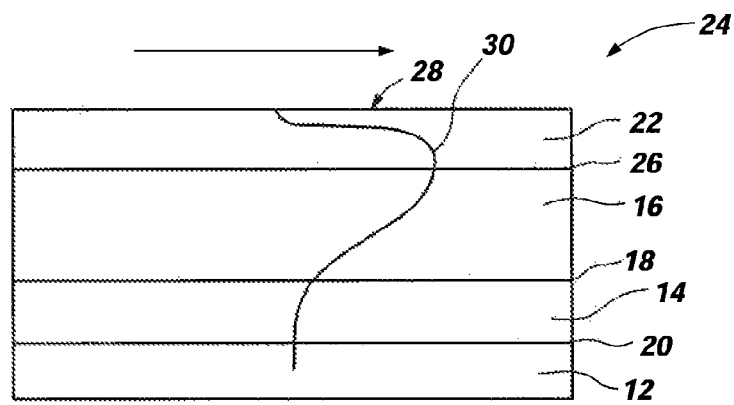
FIG. 4A illustrates areas of nitrogen concentration in the second intermediate structure of FIG. 3 after nitrogen implantation.

In this embodiment, nitrogen is implanted into the second intermediate structure 24 at a dosage and energy sufficient such that the peak of the nitrogen concentration occurs within the metal silicide layer 22 and in the polysilicon layer 16 at a silicide/polysilicon interface 26 while a relatively small amount of implanted nitrogen penetrates below the polysilicon/gate oxide interface 18. Typically, the nitrogen implantation takes place at room temperature at a dosage ranging from between about $1\times10^{15}$ atoms/cm$^2$ and about $1\times10^{16}$ atoms/cm$^2$ and at an energy ranging from between about 10 keV and about 40 keV. A desired nitrogen concentration profile of the second intermediate structure 24 after nitrogen implantation is illustrated in FIG. 4A, wherein areas of nitrogen concentration are indicated by line 28 and nitrogen concentration is increased in the direction of the arrow. As with the previous embodiment that does not include a metal silicide layer 22, the relative nitrogen concentration and the size of peak 30 depend on the thickness of the layers 14, 16 and the semiconductor substrate 12, as well as the implantation dosage and energy. Accordingly, FIG. 4A should be used for a qualitative, rather than a quantitative, understanding. Again, as with the previously described embodiment, typically not more than about $1\times10^{14}$ atoms/cm$^2$ to about $1\times10^{15}$ atoms/cm$^2$ penetrates below the polysilicon/gate oxide interface 18.

Figure 4B:
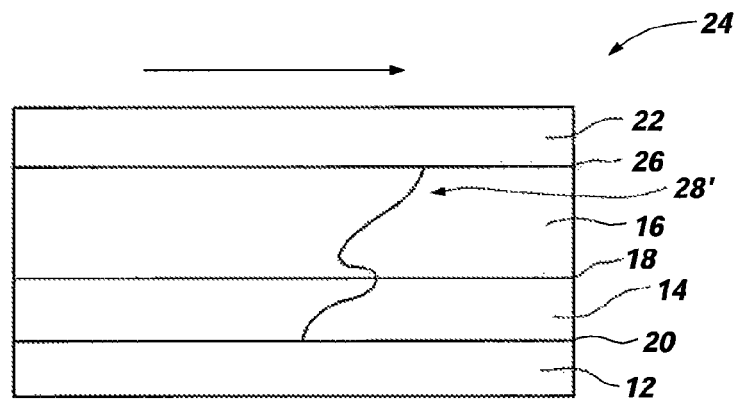
FIG. 4B illustrates areas of nitrogen concentration in the second intermediate structure of FIG. 3 subsequent to anneal.

In later processing, an anneal may be performed at between about 850° C. and 1050° C. in an ambient nitrogen environment for between about 10 seconds and 30 minutes to alter the nitrogen concentration profile of the second intermediate structure 24. A desired nitrogen concentration profile of the second intermediate structure 24 after anneal is illustrated in FIG. 4B, wherein areas of nitrogen concentration are indicated by line 28' and nitrogen is increased in the direction of the arrow. As is evident from FIG. 4B, the nitrogen concentration profile of the second intermediate structure 24 subsequent to anneal includes a relatively large nitrogen concentration at the silicide/polysilicon interface 26, a relatively smaller concentration of nitrogen at the polysilicon/gate oxide interface 18 and a relatively smaller still concentration of nitrogen within the gate oxide layer 14 and at the gate oxide/substrate interface 20. As with FIG. 4A, FIG. 4B should be used for a qualitative, rather than a quantitative, understanding.

In the second intermediate structure 24 shown in FIG. 4B, the nitrogen concentrated at the silicide/polysilicon interface 26 acts to substantially prevent cross-diffusion of dopants across the interface and the concentration of nitrogen at the polysilicon/gate oxide interface 18 acts as a diffusion barrier to prevent diffusion of dopants from the polysilicon layer 16 into and through the gate oxide layer 4. Nitrogen concentrated at the gate oxide/substrate interface 20 aids in preventing dopant diffusion as well. However, as with the previous embodiment, the concentration of nitrogen at the gate oxide/substrate interface 20 is not so great as to substantially impair device performance. Further, the nitrogen within the gate oxide layer 14 reacts with the pare oxide to form oxynitride and, accordingly, increases the dielectric constant of the gate oxide layer 14 and reduces the effective thickness thereof.

The following describes an exemplary method of forming a transistor having a gate oxide hardened according to the method of the present invention, which transistor is characterized by a relatively large nitrogen concentration at the silicide/polysilicon interface, a relatively smaller nitrogen concentration at the polysilicon/gate oxide interface and a relatively smaller still nitrogen concentration within the gate oxide and at the gate oxide/substrate interface. This example is not in any way limiting of the scope of the invention.

EXAMPLE

A gate oxide layer having a thickness of about 30 angstroms was thermally grown over a silicon substrate using methods known to those of ordinary skill in the art. A layer of polysilicon having a thickness of about 600 angstroms was subsequently deposited over the gate oxide layer followed by deposition of a layer of tungsten silicide having a thickness of about 600 angstroms atop the polysilicon layer. The dielectric constant of the gate oxide was determined and recorded.

Nitrogen was subsequently implanted into the gate stack, at room temperature, at a dosage of about $4\times10^{15}$ atoms/cm$^2$ and at an energy of about 30 keV. The resultant nitrogen-implanted gate stack had a nitrogen concentration profile approximating that illustrated in FIG. 4A with the bulk of the nitrogen concentration occurring within the metal silicide layer and in the polysilicon layer at the silicide/polysilicon interface while about 10% of the total amount of nitrogen implanted (i.e., about $4\times10^{14}$ atoms/cm$^2$) penetrated below the polysilicon/gate oxide interface. At least a portion of the implanted nitrogen penetrated into the silicon substrate.

In later processing, an anneal was performed at about 1000° C. in an ambient nitrogen environment for 20 seconds. The resultant gate stack exhibited a nitrogen concentration profile approximating that illustrated in FIG. 4B with a relatively large concentration of nitrogen occurring at the silicide/polysilicon interface, a relatively smaller nitrogen concentration occurring at the polysilicon/gate oxide interface and a relatively smaller still nitrogen concentration occurring within the gate oxide and at the gate oxide/substrate interface.

The dielectric constant of the gate oxide layer was subsequently determined and compared to that recorded prior to nitrogen implantation. It was found that the dielectric constant of the gate oxide layer increased by about 7.0%, resulting in a reduction in the effective thickness of the gate oxide layer of about 7.0%.

The present invention has been described in relation to particular embodiments that are intended in all respects to be illustrative rather than restrictive. It is to be understood that the invention defined by the appended claims is not to be limited by particular details set fort in the above description and that alternative embodiments will become apparent to those of ordinary skill in the art to which the present invention pertains without departing from the spirit and scope thereof.

What is claimed is:

1. An intermediate structure in the fabrication of an electronic device, comprising:
a semiconductor substrate comprising a gate oxide material disposed over at least a portion thereof, a polysilicon material disposed over the gate oxide material, and a metal silicide material disposed over the polysilicon material, each of the semiconductor substrate, the gate oxide material, the polysilicon material, and the metal silicide material comprising nitrogen atoms, wherein greater than about 90% by weight of a total weight of the nitrogen atoms in the semiconductor substrate, the gate oxide material, the polysilicon material, and the metal silicide material are located within an interface of the polysilicon material and the metal silicide material.

2. The intermediate structure of claim 1, wherein no more than about 10% by weight of the nitrogen atoms are located below an interface of the polysilicon material and the gate oxide material.

3. The intermediate structure of claim 1, wherein no more than from about $1\times10^{14}$ to about $1\times10^{15}$ nitrogen atoms/cm$^2$ are located below an interface of the polysilicon material and the gate oxide material.

4. The intermediate structure of claim 1, wherein at least a portion of the gate oxide material further comprises oxynitride.

5. A semiconductor structure, comprising:
a semiconductor substrate comprising a gate oxide material disposed over at least a portion thereof, a polysilicon material disposed over the gate oxide material, and a metal silicide material disposed over the polysilicon material, each of the semiconductor substrate, the gate oxide material, the polysilicon material, and the metal silicide material comprising nitrogen atoms, wherein greater than about 90% by weight of a total weight of the nitrogen atoms in the semiconductor substrate, the gate oxide material, the polysilicon material, and the metal silicide material are located within an interface of the polysilicon material and the metal silicide material, and wherein the gate oxide material and the metal silicide material comprise a gate stack.

6. The semiconductor structure of claim 5, wherein the semiconductor structure is a transistor or capacitor.

7. The semiconductor structure of claim 5, wherein at least a portion of the gate oxide material further comprises oxynitride.

8. A semiconductor structure, comprising:
a semiconductor substrate comprising a gate oxide material disposed over at least a portion thereof;
a polysilicon material disposed over the gate oxide material; and
a metal silicide material disposed over the polysilicon material,
the semiconductor structure comprising nitrogen atoms located in each of the semiconductor substrate, the gate oxide material, the polysilicon material, and the metal silicide material, wherein a nitrogen concentration profile includes a first nitrogen concentration peak located within an interface of the polysilicon material and the metal silicide material, a second nitrogen concentration peak located within an interface of the polysilicon material and the gate oxide material, and a third nitrogen concentration peak located within an interface of the gate oxide material and the substrate, the first nitrogen concentration peak greater than the second nitrogen concentration peak and the second nitrogen concentration peak greater than the third nitrogen concentration peak.

* * * * *